United States Patent
Brown et al.

(10) Patent No.: US 11,024,349 B2
(45) Date of Patent: Jun. 1, 2021

(54) MEMORY DEVICE WITH A CLOCKING MECHANISM

(71) Applicant: Micron Technology, Inc., Boise, ID (US)

(72) Inventors: Jason M. Brown, Allen, TX (US); Vijayakrishna J. Vankayala, Allen, TX (US); Todd A. Dauenbaugh, Richardson, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/401,057

(22) Filed: May 1, 2019

(65) Prior Publication Data
US 2019/0348092 A1    Nov. 14, 2019

Related U.S. Application Data

(63) Continuation of application No. 15/977,125, filed on May 11, 2018, now Pat. No. 10,395,702.

(51) Int. Cl.
*G11C 7/22*    (2006.01)
(52) U.S. Cl.
CPC ............. *G11C 7/222* (2013.01); *G11C 7/225* (2013.01)
(58) Field of Classification Search
CPC ................................. G11C 7/222; G11C 7/225
See application file for complete search history.

(56) References Cited

U.S. PATENT DOCUMENTS

| | | | | |
|---|---|---|---|---|
| 5,835,445 A | * | 11/1998 | Nakamura | G11C 7/1072 365/233.11 |
| 6,229,368 B1 | | 5/2001 | Lee | |
| 6,324,118 B1 | * | 11/2001 | Ooishi | G11C 7/1051 365/230.03 |
| 6,836,503 B2 | * | 12/2004 | Best | G06F 1/10 375/355 |
| 6,971,040 B2 | * | 11/2005 | Volk | G06F 13/4072 713/401 |
| 7,161,854 B2 | * | 1/2007 | Iwasaki | G11C 7/1072 365/189.05 |
| 7,171,321 B2 | * | 1/2007 | Best | G06F 13/1689 702/106 |
| 7,269,240 B2 | | 9/2007 | Hsu et al. | |
| 7,457,978 B2 | * | 11/2008 | Johnson | G06F 13/4234 711/100 |
| 7,492,185 B1 | * | 2/2009 | Huang | H03K 19/17744 326/38 |
| 7,835,219 B2 | | 11/2010 | Hur et al. | |
| 8,520,464 B2 | | 8/2013 | Irisawa | |
| 8,570,790 B2 | | 10/2013 | Maheshwari et al. | |
| 2005/0201163 A1 | | 9/2005 | Reichel et al. | |

* cited by examiner

Primary Examiner — Vanthu T Nguyen
(74) Attorney, Agent, or Firm — Perkins Coie LLP

(57) ABSTRACT

A memory device includes a first data driver configured to send a first data according to a first clock signal; a first data port electrically coupled to the first data driver, the first data port configured to receive the first data; a second data driver configured to send a second data according to a second clock signal, wherein the second clock signal does not match the first clock signal; and a second data port electrically coupled to the second data driver, the second data port configured to receive the second data.

13 Claims, 7 Drawing Sheets

MEMORY DEVICE WITH A CLOCKING MECHANISM

CROSS-REFERENCE TO RELATED APPLICATIONS

This application is a continuation of U.S. application Ser. No. 15/977,125, filed May 11, 2018, which is incorporated herein by reference in its entirety.

TECHNICAL FIELD

The disclosed embodiments relate to memory devices, and, in particular, to memory devices with a clocking mechanism.

BACKGROUND

Memory systems can employ memory devices to store and access information. The memory devices can include volatile memory devices, non-volatile memory devices, or a combination device. Memory devices, such as dynamic random access memory (DRAM), can utilize electrical energy to store and access data.

Due to circuit-component specifications, circuit design, etc., some performance or characteristics of the memory devices can vary greatly according to environmental and/or conditional factors. For example, a signal propagation time and/or a corresponding delay can vary based on a circuit layout (e.g., a distance between a source and a destination for data signals, a relative location of data lines and corresponding capacitances, etc.).

In view of the ever-increasing commercial competitive pressures, along with growing consumer expectations and the desire to differentiate products in the marketplace, it is increasingly desirable that answers be found to these problems. Additionally, the need to reduce costs, improve efficiencies and performance, and meet competitive pressures adds an even greater pressure to find answers to these problems.

DETAILED DESCRIPTION

As described in greater detail below, the technology disclosed herein relates to memory devices, systems with memory devices, and related methods for dynamically managing initiation of data streams. The memory devices (e.g., DRAM devices) can include a clocking mechanism configured to provide different clock signals (e.g., data clocks) to minimize the effect of propagation delay, fringing capacitance, etc. on access time.

For example, the memory device can use a first clock signal to control a first set of drivers that send data signals to a first set of data ports. The memory device can use a second clock signal to control a second set of drivers that send data signals to a second set of data ports. The arrival times between the data communicated over the first set of circuit and the second set of circuit can differ (e.g., different propagation delays) according to a variety of factors. In some embodiments, the second data ports can be further from the drivers than the first data ports. In some embodiments, the second communication circuit can include additional repeaters, buffers, signal amplifiers, etc. that are not present in the first communication circuit. In some embodiments, the layout or relative locations of the first and/or second communication circuits can introduce fringing capacitances between the metal routes of the communication circuits.

The memory device can account for the different propagation delays based on using different clock signals. For example, the memory device can generate the first clocking signal based on delaying the second clocking signal by a delay duration. The delay duration can be based on a separation distance between the first data ports and the second data ports (e.g., the additional distance traveled by the communication signals), a delay characteristic of circuit components (e.g., repeaters, buffers, signal amplifiers, etc.), a magnitude of the fringing capacitances, etc. The delay duration can also be based on signal coupling scenarios and the corresponding propagation delays.

Figure 1:
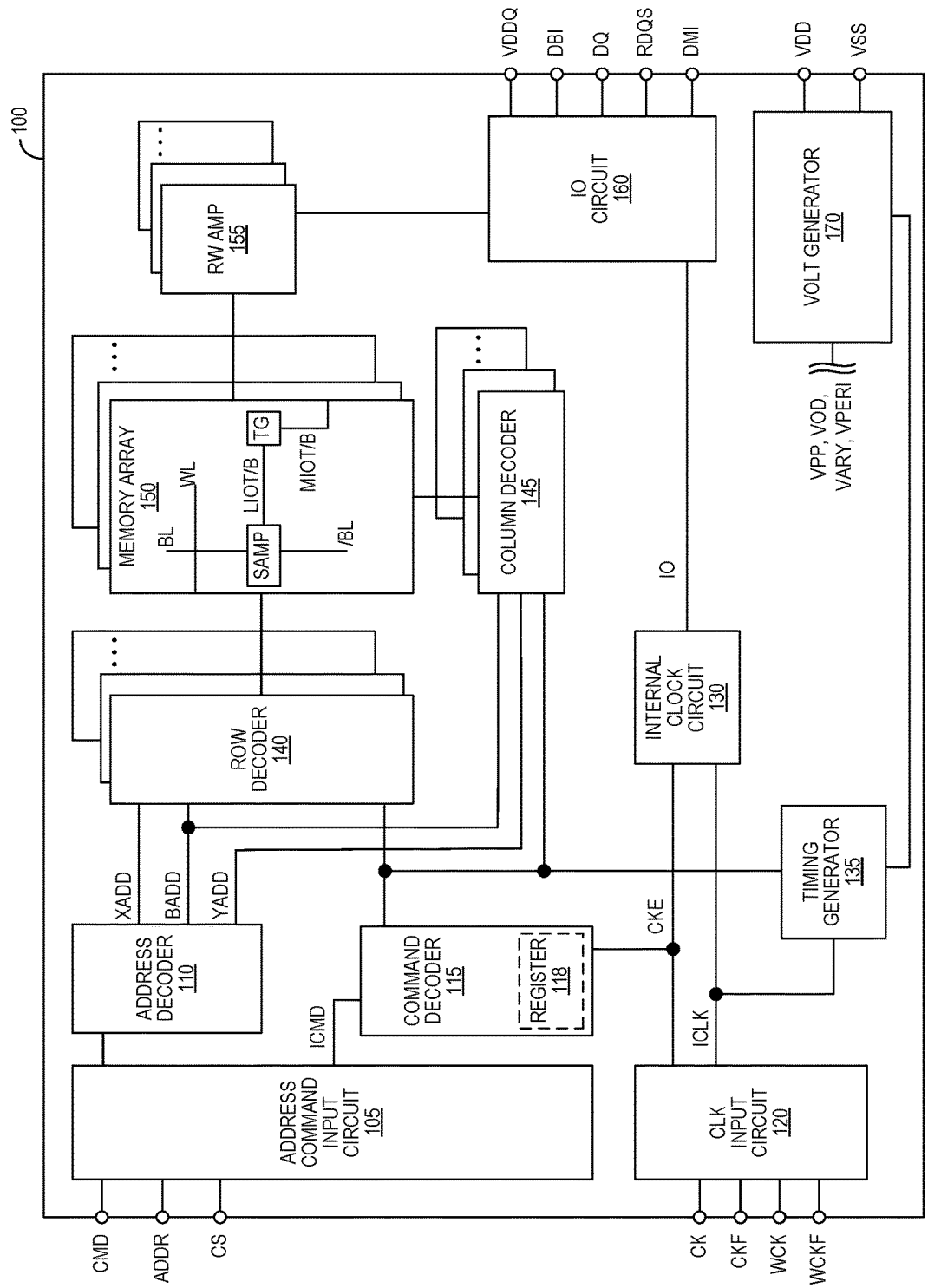
FIG. 1 is a block diagram of a memory device in accordance with an embodiment of the present technology.

FIG. 1 is a block diagram of a memory device 100 (e.g., a semiconductor memory device, such as a DRAM device) in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK. The command decoder 115 may further include one or more registers 117 for tracking various counts or values (e.g., counts of refresh commands received by the memory device 100 or self-refresh operations performed by the memory device 100).

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

Through the connection, the memory device 100 can exchange data with other devices or circuits. For example, the memory device 100 can access the data stored in the memory array 150 and send it through the DQ data terminals. The data access/communication can correspond to an access time (e.g., an amount of time needed to get stable output after a change in address, 'Taa') and/or column-to-column delay (e.g., a minimum amount of time between column operations, 'Tccd'). The access time and/or the column-to-column delay can correspond to an amount of time necessary to send the data from the memory array 150 to the corresponding port (e.g., represented as 'DQ' from the input/output circuit 160). For example, the access time and/or the column-to-column delay may have to account for worst-case propagation delay between the memory array 150 and the DQ ports.

However, by utilizing different clock signals, the memory device 100 can account for the different propagation delays, such as across different DQ communication lines/circuits and/or across different signal transitions, and improve the access time and the column-to-column delay. For example, the memory device 100 can use a reference clock signal for circuits that experience longer propagation delays due to longer physical length in the traces, additional buffers/repeaters in the circuit, fringing capacitances due to adjacent communication lines, etc. For other circuits, such as ones that have short traces between the array and the DQ ports, that have less or no buffers/repeaters in the circuit, that experience less or no fringing capacitances, etc., the memory device 100 can use a delayed clock signal. The delay amount can be based on the contributing factors.

Figure 2:
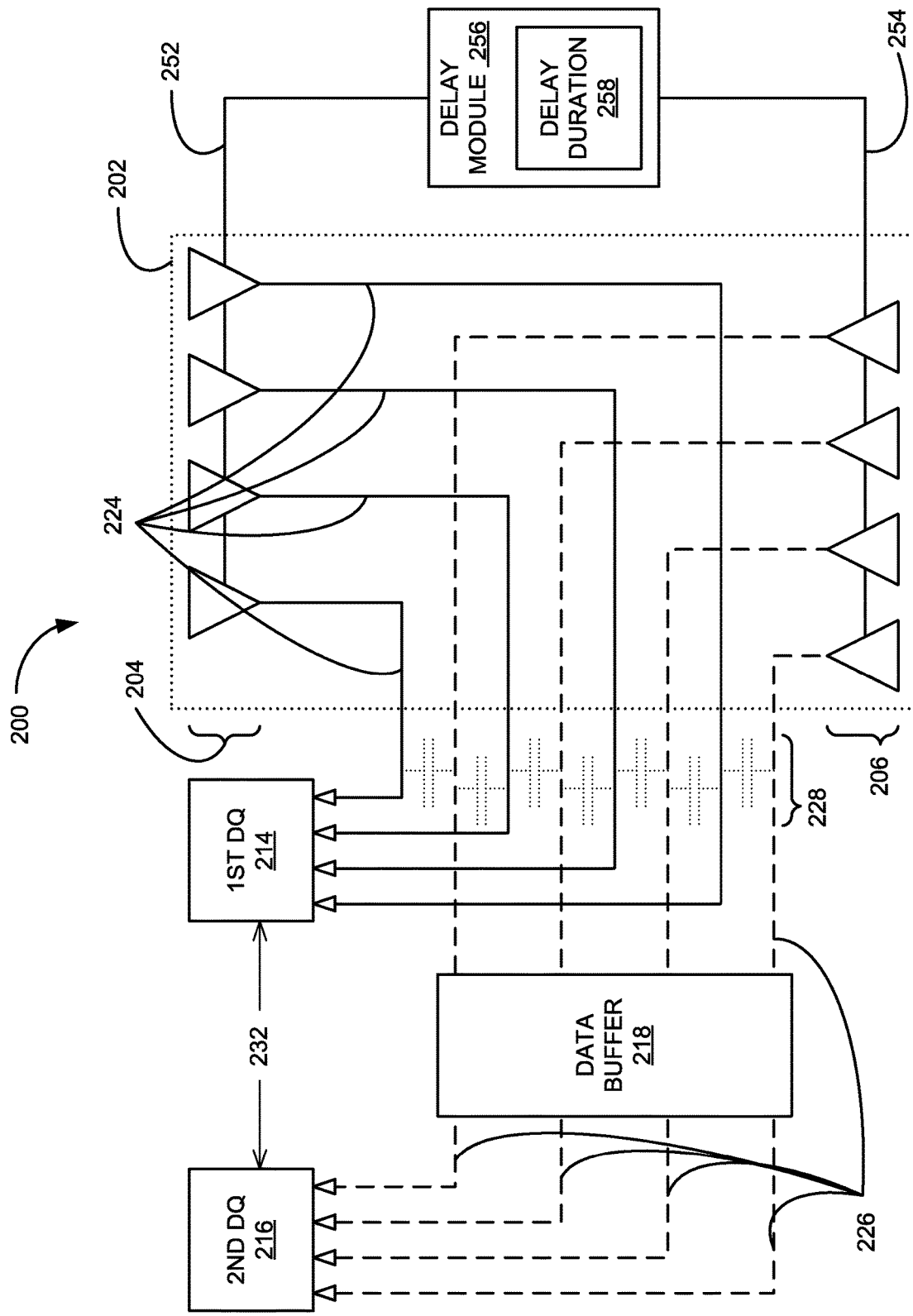
FIG. 2 illustrates a block diagram of an example data communication circuit in accordance with an embodiment of the present technology.

FIG. 2 illustrates a block diagram of an example data communication circuit 200 in accordance with an embodiment of the present technology. The data communication circuit 200 can illustrate the circuit between the memory array 150 of FIG. 1 and the input/output circuit 160 of FIG. 1 (e.g., the DQ ports).

In some embodiments, the memory device 100 of FIG. 1 can include a data junction 202 that includes a first driver set 204, a second driver set 206, etc. The data junction 202 can be a physical portion of the memory device 100 (e.g., a silicon die or a chip). For example, the data junction 202 can be a center/middle portion of the silicon die/chip that is near/under/over the data array.

The first driver set 204 and the second driver set 206 can include transmitters/driver circuits configured to send data to connected ports/circuit components. The first driver set 204 can be connected to a first set of data ports 214 through first data lines 224, and the second driver set 206 can be connected to a second set of data ports 216 through second data lines 226. In some embodiments, the first data lines 224 and the second data lines 226 can be interleaved as illustrated in FIG. 2. In some embodiments, the first data ports 214 and the second data ports 216 can be physically located at different location/regions on the die/chip, separated by a port separation distance 232. Accordingly, a distance from the data junction 202 to the second data ports 216 can be farther by the port separation distance 232 (e.g., 1-5000 μm) in comparison to a distance from the data junction 202 to the first data ports 214. In some embodiments, the communication circuit 200 can include a data buffer module 218 between the data junction 202 and the second data ports 216.

Due to the physical arrangement of the communication lines, the data communication circuit 200 can include fringing capacitance 228 between adjacent communication lines (e.g., traces). For example, adjacent/parallel metal traces can be separated by an electrical insulator, and due to such arrangement, act as a capacitor.

The fringing capacitance 228 can affect (e.g., increase) propagation of signal through the data lines (e.g., the first data lines 224, the second data lines 226, etc.). In addition, the data buffer 218, the port separation distance 232, etc. can affect the propagation of the signal. As illustrated in FIG. 2, signals traveling to the second data ports 216 can experience greater propagation delay. Accordingly, for simultaneously transmitted signals (e.g., from both the first driver set 204 and the second driver set 206), data can arrive later at the second data ports 216 than at the first data ports 214.

To account for such differences in propagation delays across the communication paths, the data communication circuit 200 use different clock signals for each communication path. For example, the first communication circuit (e.g., from the first driver set 204 to the first data ports 214) can operate based on one or more first clock inputs 252, and the second communication circuit (e.g., from the second driver set 206 to the second data ports 216) can operate based on one or more second clock inputs 254. The data communication circuit 200 can include a delay module 256 configured to generate the first clock inputs 252, the second clock inputs 254, etc. In some embodiments, the delay module 256 can generate the first clock inputs 252 based on delaying the second clock inputs 254 by a delay duration 258.

Figure 3:
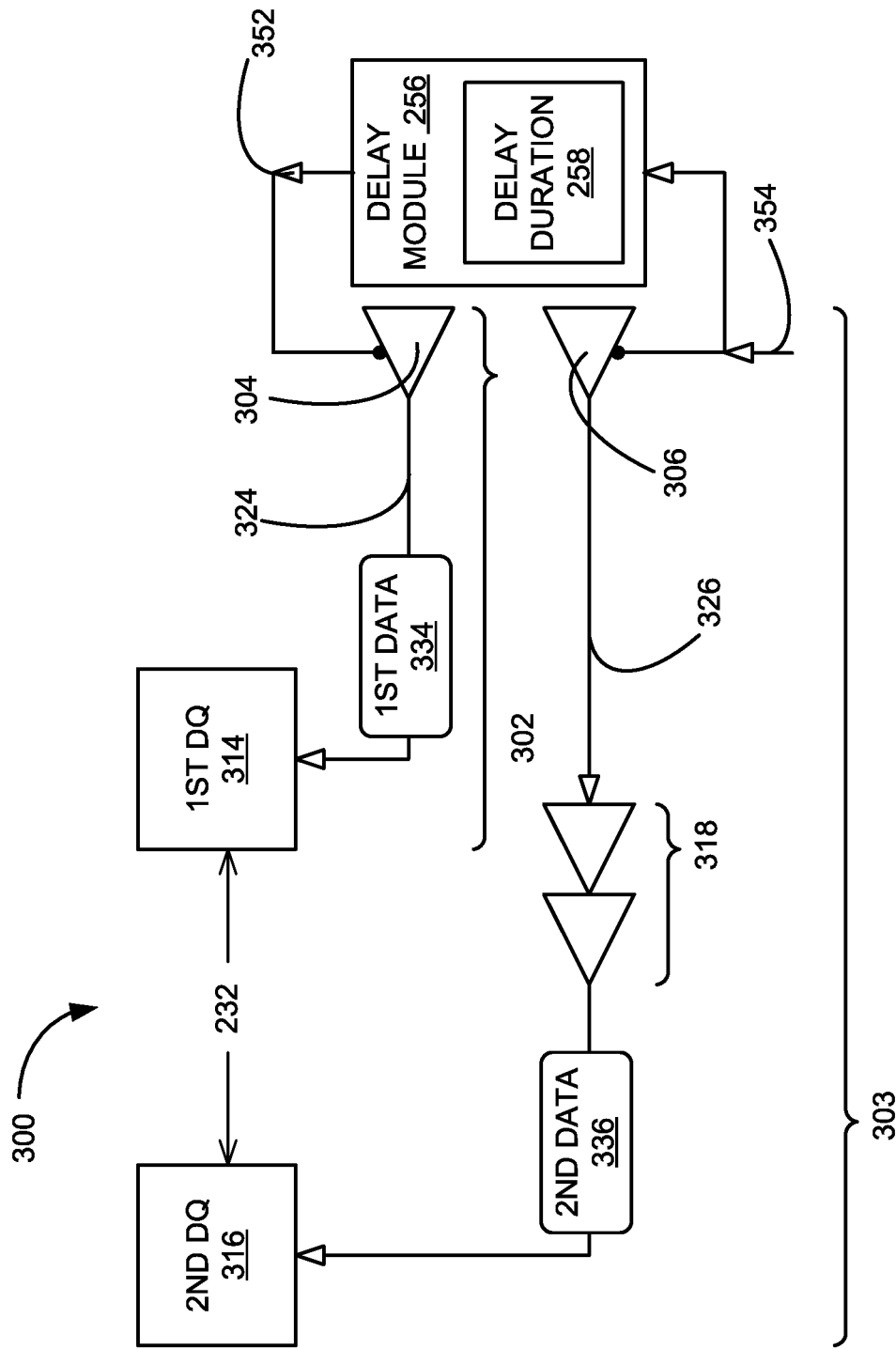
FIG. 3 illustrates a detailed block diagram of an example data communication circuit in accordance with an embodiment of the present technology.

FIG. 3 illustrates a detailed block diagram of an example data communication circuit 300 in accordance with an embodiment of the present technology. The data communication circuit 300 can be a portion of the data communication circuit 200 of FIG. 2. For example, the data communication circuit 300 can include a first circuit 302 including a connection (e.g., a first line 324) between one of the drivers (e.g., a first driver 304) in the first driver set 204 of FIG. 2 and one of the ports (e.g., a first port 314) in the first data ports 214 of FIG. 2. The first circuit 302 can be used to communicate first data 334. Also, the data communication circuit 300 can include a second circuit 303 including a connection (e.g., a second line 326) between one of the drivers (e.g., a second driver 306) in the second driver set 206 of FIG. 2 and one of the ports (e.g., a second port 316) in the second data ports 216 of FIG. 2. The second circuit 303 can further include a buffer 318 between the second driver 306 and the second port 316. The second circuit 303 can be used to communicate second data 336.

As discussed above, the first data 334 can experience less propagation delay through the first circuit 302 than the second data 336 communicated through the second circuit 303. The increased propagation delay for the second circuit 303 can be based on the port separation distance 232, the buffer 318, a shape or a relationship between the second data 336 and data (e.g., the first data 334) communicated on other adjacent data lines.

As illustrated in FIG. 3, the delay module 256 can control a transmission timing of the first data 334 and the second data 336. In some embodiments, the delay module 256 can generate a first clock signal 352 that controls the transmission timing of the first data 334. The delay module 256 can generate the first clock signal 352 based on a second clock signal 354 that is configured to control the transmission timing of the second data 336. For example, the delay module 256 can generate the first clock signal 352 based on delaying the second clock signal 354 according to the delay duration 258. Accordingly, the first data 334 can be transmitted after the delay duration 258 following transmission of the second data 336.

Using multiple clock signals (e.g., the first clock signal 352 and the second clock signal 354) instead of a common clock signal can improve propagation delay for the memory device 100 and related performance characteristics (e.g., the access time, the column-to-column delay, etc.). Accordingly, the electronic device can reduce an amount of variation in signal arrival times across different communication circuits, thereby increasing uniformity in data communication across different locations/portions of the die.

Figure 4A:
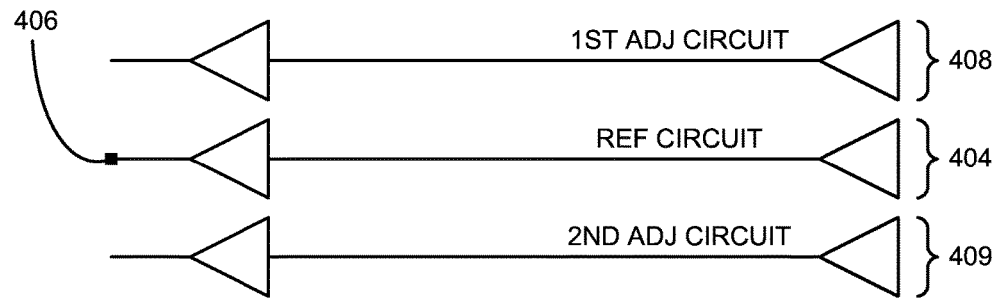
FIG. 4A illustrates a set of adjacent communication circuits in accordance with an embodiment of the present technology.

FIG. 4A illustrates a set of adjacent communication circuits in accordance with an embodiment of the present technology. The adjacent communication circuits can be a portion of the data communication circuit 200 of FIG. 2. FIG. 4A can illustrate a reference circuit 404 (e.g., the second circuit 303 of FIG. 3) that includes its driver, data line, and/or a portion thereof physically located between that/those of a first adjacent circuit 408 (e.g., an instance of the first circuit 302 of FIG. 3) and a second adjacent circuit 409 (e.g., a different instance of the first circuit 302 of FIG. 3).

Figure 4B:
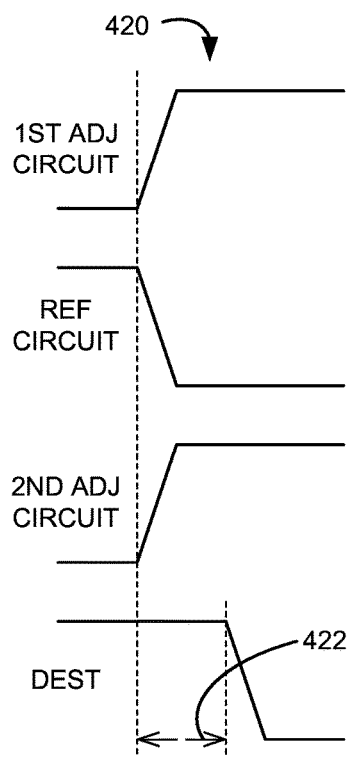
FIG. 4B illustrates a timing diagram for negatively coupled signals sent through the set of adjacent communication circuits in accordance with an embodiment of the present technology.
Figure 4C:
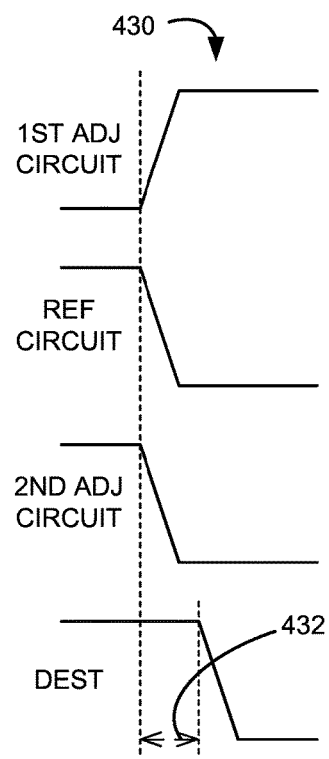
FIG. 4C illustrates a timing diagram for neutrally coupled signals sent through the set of adjacent communication circuits in accordance with an embodiment of the present technology.
Figure 4D:
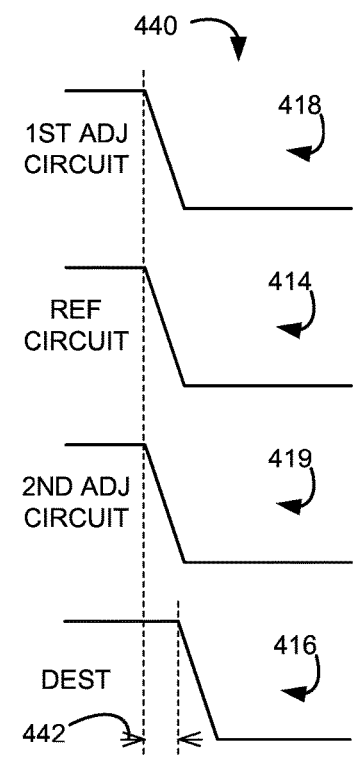
FIG. 4D illustrates a timing diagram for positively coupled signals sent through the set of adjacent communication circuits in accordance with an embodiment of the present technology.

FIGS. 4B-4D illustrate propagation delays corresponding to different signal combinations between adjacent communication lines/circuits. Based to the fringing capacitance 228 of FIG. 2, the data signal in the reference circuit 404 can be affected by the data signals in the first adjacent circuit 408 and/or the second adjacent circuit 409. Also, different combination of the signal levels/transitions between the adjacent lines can affect a signal arrival time or a propagation delay. For example, the data can arrive at a data destination 406 after a different amount of propagation delay that depend on relative shapes/transitions of the adjacent circuits. FIGS. 4B-4D illustrate different shape/transition combinations of a reference signal 414 communicated over the reference circuit 404, a first signal 418 communicated over the first adjacent circuit 408, and a second signal 419 communicated over the second adjacent circuit 409. Further, FIGS. 4B-4D illustrate a received signal 416 representing the reference signal 414 received or arriving at the data destination 406.

FIG. 4B illustrates a negative coupling scenario 420. The negative coupling scenario 420 can include the reference signal 414 having a shape/transition different or opposite of shapes/transitions of signals (e.g., the first signal 418 and the second signal 419) communicated over the adjacent circuits (e.g., the first adjacent circuit 408 and the second adjacent circuit 409). For example, when the reference signal 414 includes a high-to-low transition, both the first signal 418 and the second signal 419 can include low-to-high transitions.

For the negative coupling scenario 420, the received signal 416 can be delayed from transmission of the reference signal 414 by a negative-coupling delay 422. The negative-coupling delay 422 ('T+α') can include a base propagation delay ('T') caused by a trace length/size, a buffer/repeater in the circuit, etc. and a coupling delay ('α') caused by the negative coupling scenario 420. In some embodiments, the coupling delay can be 1 pico second or greater.

FIG. 4C illustrates a neutral coupling scenario 430. The neutral coupling scenario 430 can include the reference signal 414 having a shape/transition matching that of one of the signals communicated over the adjacent circuits. For example, when the reference signal 414 includes a high-to-low transition, the first signal 418 can include a low-to-high transition and the second signal 419 can include a high-to-low transition or vice versa.

For the neutral coupling scenario 430, the received signal 416 can be delayed from transmission of the reference signal 414 by a neutral-coupling delay 432. The neutral-coupling delay 432 ('T') can include the base propagation delay. For the neutral coupling scenario 430, the coupling delay ('α') can be absent.

FIG. 4D illustrates a positive coupling scenario 440. The positive coupling scenario 440 can include the reference signal 414 having a shape/transition matching shapes/transitions of signals (e.g., the first signal 418 and the second signal 419) communicated over the adjacent circuits (e.g., the first adjacent circuit 408 and the second adjacent circuit 409). For example, when the reference signal 414 includes a high-to-low transition, both the first signal 418 and the second signal 419 can include high-to-low transitions.

For the positive coupling scenario 440, the received signal 416 can be delayed from transmission of the reference signal 414 by a positive-coupling delay 442. The positive-coupling delay 442 ('T−β') can include the base propagation delay ('T') reduced by the coupling delay ('β'). In some embodiments, the coupling delay can be 1 pico second or greater. In some embodiments, the coupling delay ('β') of the positive coupling scenario 440 can be equal to the coupling delay ('α') of the negative coupling scenario 420.

Figure 5:
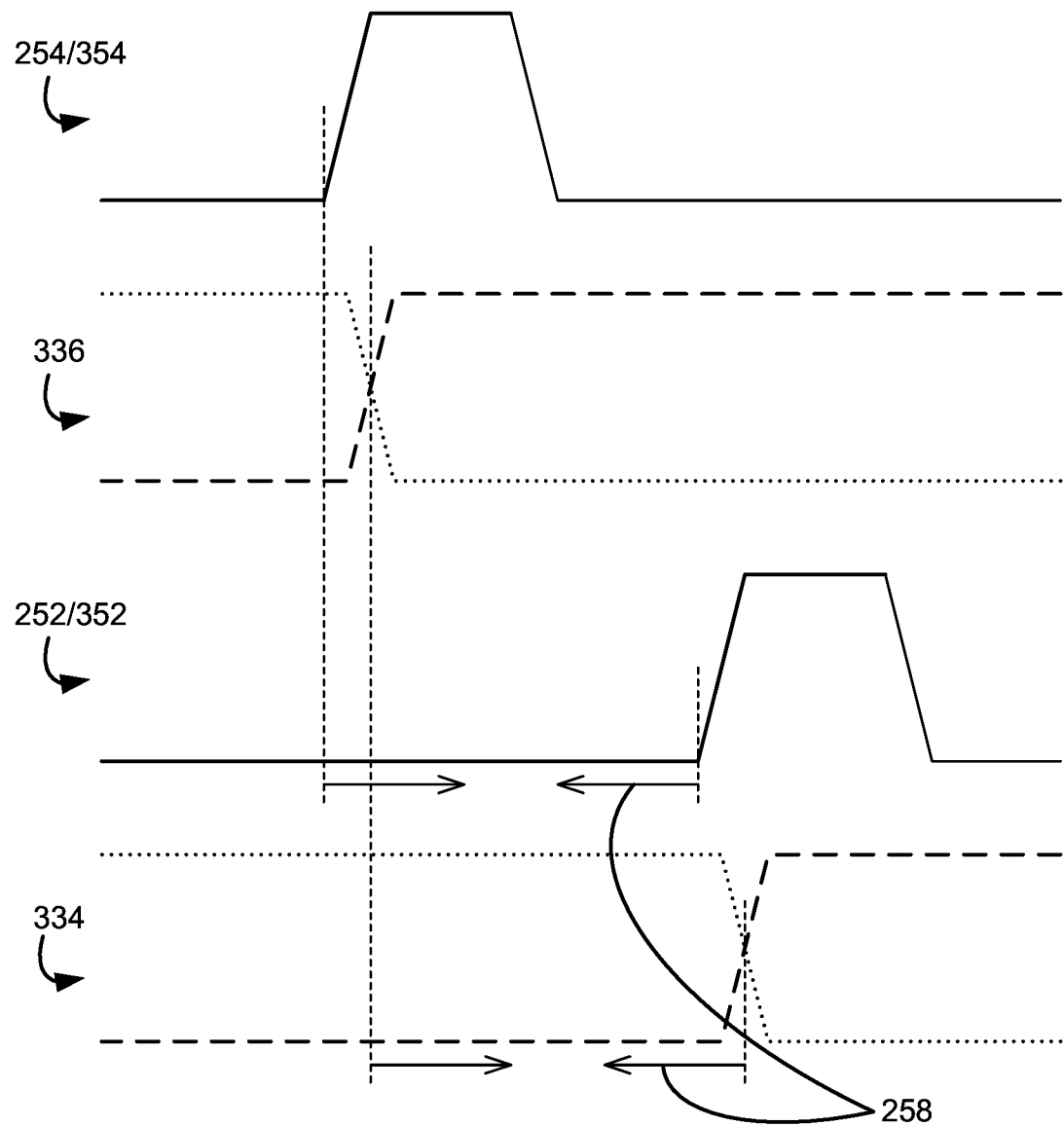
FIG. 5 illustrates a timing diagram for a pair of adjacent communication circuits in accordance with an embodiment of the present technology.

FIG. 5 illustrates a timing diagram for a pair of adjacent communication circuits in accordance with an embodiment of the present technology. Instead of simultaneously transmitting signals across adjacent circuits, as exemplified in FIGS. 4B-4D, the memory device 100 of FIG. 1 can delay one of the signals. For example, the delay module 256 of FIG. 2 can generate the first clock inputs 252 or the first clock signal 352 based on delaying the second clock inputs 254 or the second clock signal 354 by the delay duration 258. Accordingly, the first data 334 can be transmitted later/after the second data 336 by the delay duration 258.

As such, using the offset timing signals, the memory device 100 can avoid the various coupling scenarios (e.g., the negative coupling scenario 420, the neutral coupling scenario 430, the positive coupling scenario 440, etc., all of FIG. 4) and their corresponding effects on the propagation delay. Accordingly, the offset timing signals can reduce the variance in the propagation delay and improve the timing characteristics (e.g., the access time, the column-to-column delay, etc.) for the memory device 100. Also, the offset timing signals can provide the benefits without using shields between data lines, and as such, can provide the benefits without devoting die space for the shields.

In some embodiments, the delay duration 258 can be based on a longest propagation delay and a shortest propagation delay. For example, the delay duration 258 can be between the negative-coupling delay 422 and the positive-coupling delay 442. Also, the delay duration 258 can be based on or equal to the neutral-coupling delay 432. The delay duration 258 can be a delay amount associated with the buffers, a delay amount associated with the port separation distance 232 of FIG. 2. The delay duration 258 can be between 1-1000 pico seconds.

Figure 6:
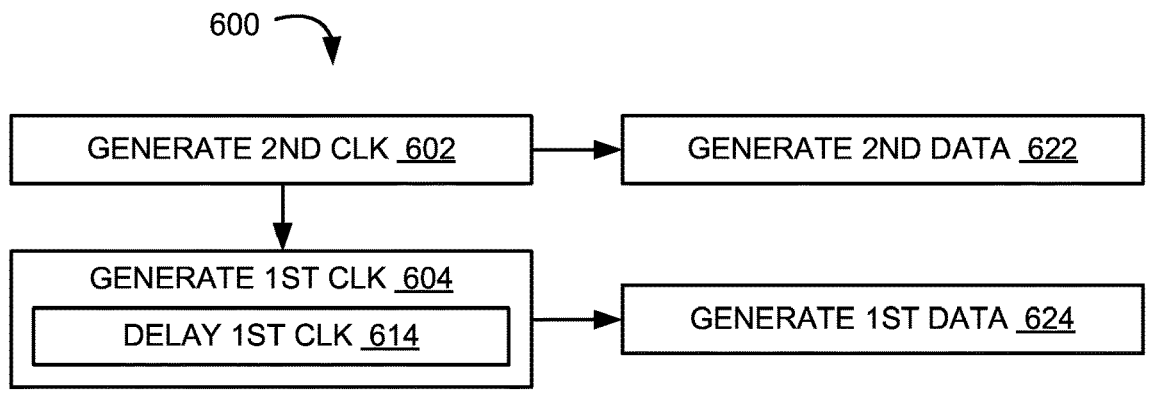
FIG. 6 is a flow diagram illustrating an example method of operating the memory device of FIG. 1 in accordance with an embodiment of the present technology.

FIG. 6 is a flow diagram illustrating an example method 600 of operating the memory device 100 of FIG. 1 in accordance with an embodiment of the present technology. The method 600 can be for operating the data communication circuit 200 of FIG. 2, the data communication circuit 300 of FIG. 3, etc. The method 600 can be for generating clock signals and sending data according to the clock signals.

At block 602, the memory device 100 (e.g., the delay module 256 of FIG. 2) can generate the second clock inputs 254 of FIG. 2 (e.g., the second clock signal 354 of FIG. 3) for driving the second driver set 206 of FIG. 2 (e.g., the second driver 306 of FIG. 3). The memory device 100 can generate the clock signals for operating the communication circuits corresponding to longer/longest propagation delay. For example, the memory device 100 can generate the clock signals configured to drive the drivers coupled to the farthest data port (i.e., relative to the data junction 202 of FIG. 2 including the drivers), including the data buffer 218 of FIG. 2, etc.

At block 604, the memory device 100 (e.g., the delay module 256) can generate the first clock inputs 252 of FIG. 2 (e.g., the first clock signal 352 of FIG. 3) for driving the first driver set 204 of FIG. 2 (e.g., the first driver 304 of FIG. 3). The memory device 100 can generate the clock signals for operating the communication circuits corresponding to shorter/shortest propagation delay. For example, the memory device 100 can generate the clock signals configured to drive the drivers coupled to the nearer/nearest data port, including less or none the data buffer 218 of FIG. 2, etc.

The memory device 100 can generate the first clock inputs 252 offset from the second clock inputs 254. For example, at block 614, the memory device 100 can generate the first clock inputs 252 by delaying the second clock inputs 254.

The delay module 256 can receive the second clock inputs 254 as inputs. Based on the input, the delay module 256 can generate the first clock inputs 252 according to the delay duration 258 of FIG. 1. In some embodiments, the delay module 256 can generate the first clock inputs 252 based on delaying the second clock inputs 254 by the delay duration 258. Accordingly, the first clock inputs 252 can be delayed from the second clock inputs 254 by the delay duration 258.

In generating the delayed clock signals, the memory device 100 can use the delay duration 258 that corresponds to one or more characteristics of communication circuits. For example, the memory device 100 can delay the signal according to a propagation delay caused by the fringing capacitance 228 of FIG. 2 associated with physical configuration of the data lines (e.g., the first data lines 224 of FIG. 2, the second data lines 226 of FIG. 2, etc.). Also, the memory device 100 can delay the signal according to a propagation delay caused by the data buffer 218 in the communication circuit. Also, the memory device 100 can delay the signal according to a propagation delay associated with the port separation distance 232 of FIG. 2.

At blocks 622 and 624, the memory device 100 (e.g., the first driver set 204, the second driver set 206, etc.) can generate data according to the separate clock signals. At block 622, the memory device 100 can generate the second data 336 of FIG. 3 according to the second clock inputs 254. At block 624, the memory device 100 can generate the first data 334 of FIG. 3 according to the first clock inputs 252. In other words, the first clock inputs 252 (e.g., the first clock signal 352) can trigger transmission of the first data 334 to the first data ports 214 of FIG. 2 (e.g., the first port 314 of FIG. 3), and the second clock inputs 254 (e.g., the second clock signal 354) can trigger transmission of the second data 336 to the second data ports 216 of FIG. 2 (e.g., the second port 316 of FIG. 3). Accordingly, the first data 334 can be sent offset from (e.g., after) the second data 336 instead of using the same clock signal to simultaneous send data over different circuits. The delay between the data transmissions can be the delay duration 258.

Figure 7:
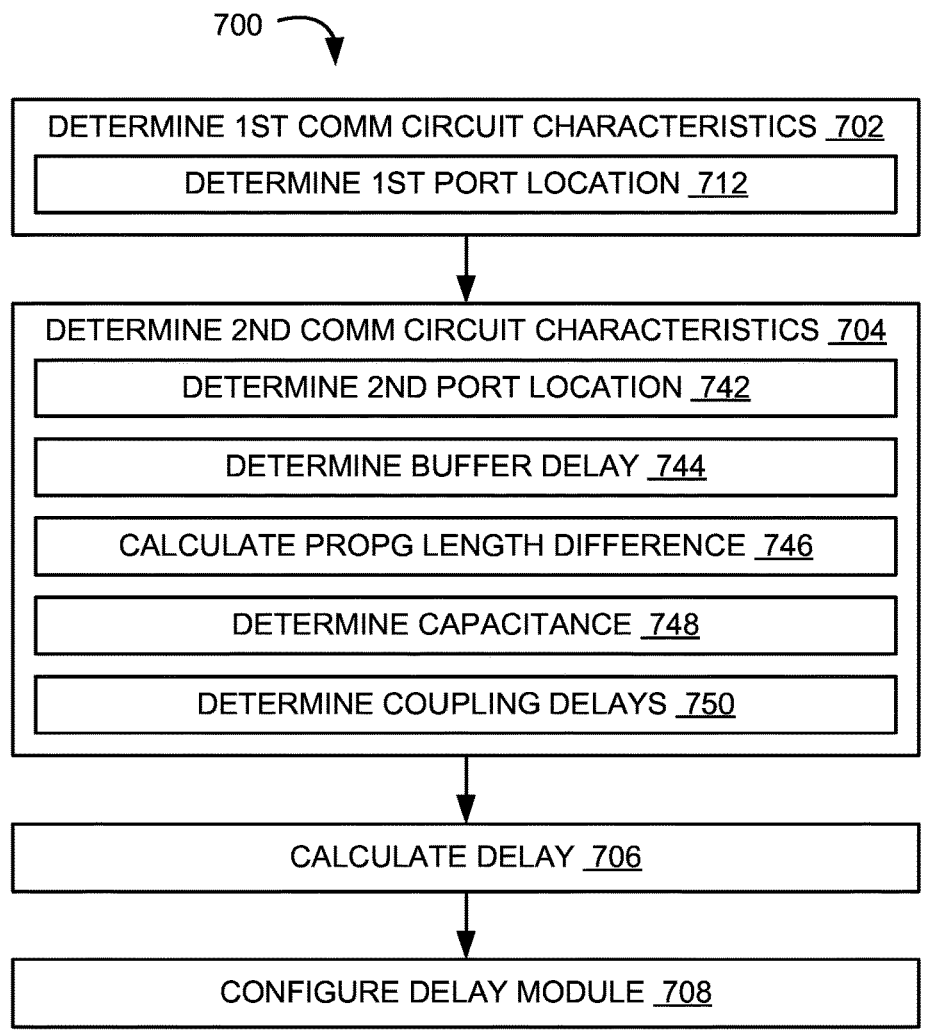
FIG. 7 is a flow diagram illustrating an example method of manufacturing the memory device of FIG. 1 in accordance with an embodiment of the present technology.

FIG. 7 is a flow diagram illustrating an example method 700 of manufacturing the memory device 100 of FIG. 1 in accordance with an embodiment of the present technology. The method 700 can be for manufacturing the memory device 100 to implement multiple different/delayed clock signals and corresponding offset data transmissions.

The method 700, such as at block 702, can include determining circuit characteristics of a first communication circuit (e.g., the first circuit 302 of FIG. 3). In some embodiments, the circuit characteristics can include location on the memory device 100 of data ports configured to receive data from corresponding drivers. For example, at block 712, locations of the first data ports 214 of FIG. 2 can be determined. In some embodiments, the locations can be determined based on the layout/design of the memory device 100. In some embodiments, the locations can be measured using outside tools or estimated using predetermined methods.

At block 704, circuit characteristics of a second communication circuit (e.g., the second circuit 303 of FIG. 3) can be determined. For example, at block 742, locations of the second data ports 216 of FIG. 2 can be determined. The locations can be determined similarly as described above.

The method 700 can include determination of other circuit characteristics in addition to or separate from the port locations. For example, at block 744, buffer delays can be determined. Each buffer or combination of buffers can correspond to a known or measurable amount of delay.

Accordingly, determination of the buffer delays can include identification of the buffers in each circuit and accessing/looking up/measuring the time delays associated with the buffers.

At block 746, the port separation distance 232 of FIG. 2 can be calculated. The port separation distance 232 can be calculated in reference to the data junction 202 of FIG. 2 including the drivers. The port separation distance 232 can be calculated based on calculating a difference in lengths of the first data lines 224 of FIG. 2 and the second data lines 226 of FIG. 2.

At block 748, the fringing capacitance 228 of FIG. 2 can be determined. In some embodiments, the fringing capacitance 228 can be calculated/estimated based on a separation distance between the data lines, the insulation material between the data lines, etc. In some embodiments, the fringing capacitance 228 can be measured.

At block 750, the signal-coupling delays (e.g., the negative-coupling delay 422, the neutral-coupling delay 432, the positive-coupling delay 442, all of FIG. 4, etc.) can be determined. The signal-coupling delays can be determined based on the fringing capacitance 228 or similarly as the fringing capacitance 228.

At block 706, the delay duration 258 of FIG. 2 can be calculated based on one or more of the circuit characteristics. In some embodiments, the delay duration 258 can be calculated based on combining (e.g., adding or combining according to a predetermined equation/method) the delay amounts caused by the characteristics of the corresponding circuit. For example, the delay duration 258 can be calculated based on the first port location and the second port location, etc. Also, the delay duration 258 can be calculated based on the fringing capacitance 228, the buffer delay, the port separation distance 232, etc.

In some embodiments, the delay duration 258 can be calculated according to worst and/or best case propagation scenarios for the communication circuits. For example, the delay duration 258 can be calculated to be greater than the positive-coupling delay 442 associated with the positive coupling scenario 440, less than the negative-coupling delay 422 associated with the negative coupling scenario 420, etc. In some embodiments, the delay duration 258 can be calculated based on, such as matching or adjusting, the neutral-coupling delay 432 associated with the neutral coupling scenario 430. In some embodiments, the delay duration 258 can be calculated based on a predetermined method/equation that uses the positive-coupling delay 442, the negative-coupling delay 422, the neutral-coupling delay 432, or a combination thereof.

At block 708, the memory device 100 can be configured to implement the delay duration 258 in generating separate/offset clock signals. For example, circuitry, software, or firmware for the delay module 256 of FIG. 2 can be set according to the delay duration 258.

Figure 8:
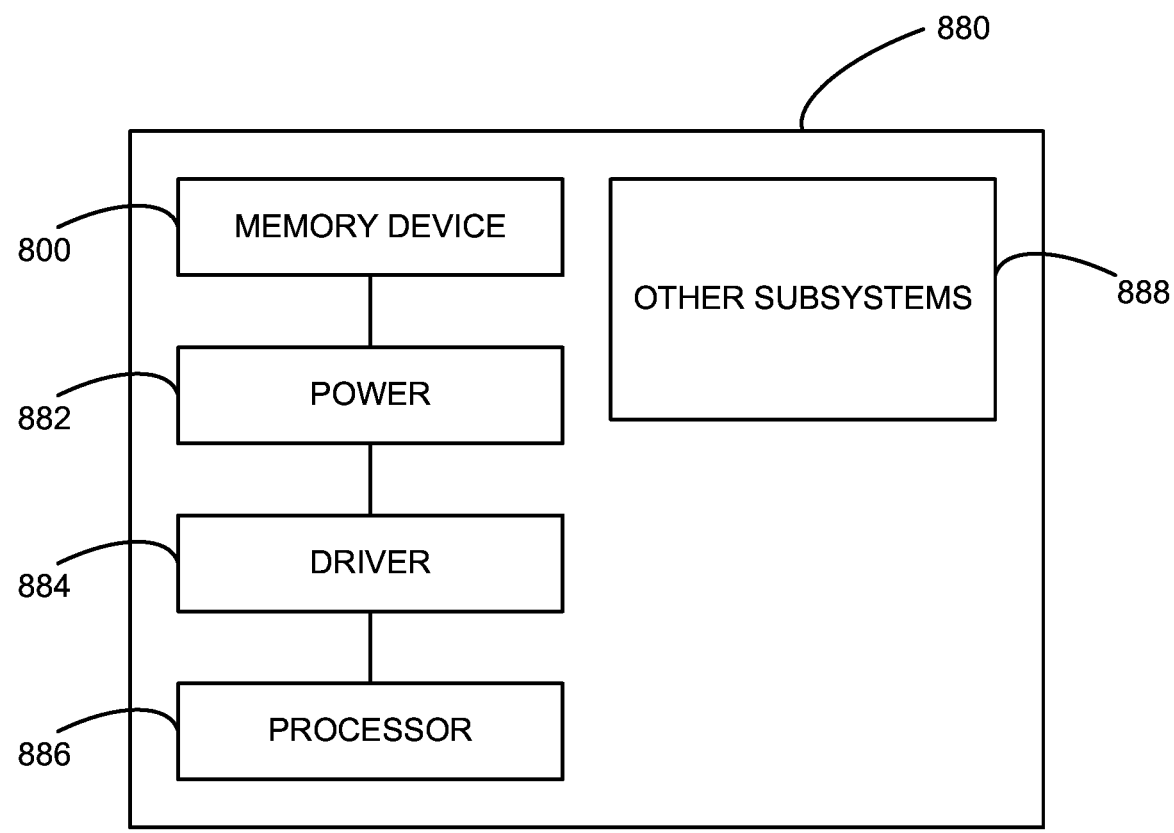
FIG. 8 is a schematic view of a system that includes a memory device in accordance with an embodiment of the present technology.

FIG. 8 is a schematic view of a system that includes a memory device in accordance with embodiments of the present technology. Any one of the foregoing memory devices described above with reference to FIGS. 1-7 can be incorporated into any of a myriad of larger and/or more complex systems, a representative example of which is system 880 shown schematically in FIG. 8. The system 880 can include a memory device 800, a power source 882, a driver 884, a processor 886, and/or other subsystems or components 888. The memory device 800 can include features generally similar to those of the memory device described above with reference to FIGS. 1-7, and can therefore include various features for performing a direct read request from a host device. The resulting system 880 can perform any of a wide variety of functions, such as memory storage, data processing, and/or other suitable functions. Accordingly, representative systems 880 can include, without limitation, hand-held devices (e.g., mobile phones, tablets, digital readers, and digital audio players), computers, vehicles, appliances and other products. Components of the system 880 may be housed in a single unit or distributed over multiple, interconnected units (e.g., through a communications network). The components of the system 880 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the memory devices have been described in the context of DRAM devices. Memory devices configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-8.

We claim:

1. A memory device, comprising:
a first set of data drivers configured to send a first data according to a first clock signal;
a first set of DQ ports electrically coupled to the first set of data drivers, the first set of DQ ports configured to receive the first data from the first set of data drivers;

a second set of data drivers configured to send a second data according to a second clock signal, wherein:
the second clock signal does not match the first clock signal, and
a temporal relationship exists between the first clock signal and the second clock signal, wherein the temporal relationship represents a difference in propagation delays associated with (1) signal combinations between adjacent circuits, (2) distances between data drivers and corresponding DQ ports, (3) retransmissions between the data drivers and the corresponding DQ ports, (4) relative locations of the data drivers and the corresponding DQ ports, or a combination thereof;
a second set of DQ ports electrically coupled to the second set of data drivers, the second set of DQ ports configured to receive the second data from the second set of data drivers;
a first adjacent data line electrically coupling the first set of data drivers to the first set of DQ ports;
a reference data line electrically coupling the second set of data drivers to the second set of DQ ports;
a second adjacent circuit including a further driver coupled to a further port through a further data line, wherein
the reference data line, the second set of data drivers, or a combination thereof is located between the second adjacent circuit and a first adjacent circuit comprising the first set of data drivers, the first set of DQ ports, and the first adjacent data line; and
a delay module configured to generate the first clock signal based on delaying the second clock signal by a delay duration that is based on fringing capacitances associated with physical configuration of the first adjacent circuit and the second adjacent circuit relative to the reference data line, the second data set of drivers, or a combination thereof.

2. The memory device of claim 1, wherein the delay duration is greater than a positive-coupling delay associated with a positive coupling scenario, wherein:
the positive-coupling delay represents a duration between transmission of the second data and arrival of the second data at the second set of DQ ports; and
the positive coupling scenario corresponds to the second data having a transition simultaneous with matching transitions in the first data and data communicated in the second adjacent circuit.

3. The memory device of claim 1, wherein the delay duration is less than a negative-coupling delay associated with a negative coupling scenario, wherein:
the negative-coupling delay represents a duration between transmission of the second data and arrival of the second data at the second set of DQ ports; and
the negative coupling scenario corresponds to the second data having a transition simultaneous with differently shaped transitions in the first data and data communicated in the second adjacent circuit.

4. The memory device of claim 1, wherein the delay duration is based on a neutral-coupling delay associated with a neutral coupling scenario, wherein:
the neutral-coupling delay represents a duration between transmission of the second data and arrival of the second data at the second set of DQ ports; and
the neutral coupling scenario corresponds to the second data having a transition simultaneous with one differently shaped transitions and one matching transition in the first data and data communicated in the second adjacent circuit.

5. The memory device of claim 1, wherein:
a distance between the second set of data drivers and the second set of DQ ports is greater than a distance between the first set of data drivers and the first set of DQ ports by a port separation distance; and
the delay duration is based on the port separation distance.

6. The memory device of claim 5, further comprising:
a first set of data lines having a first length and electrically connecting the first set of data drivers to the first set of DQ ports; and
a second set of data lines having a second length and electrically connecting the second set of data drivers to the second set of DQ ports, wherein:
the second length is greater than the first length by the port separation distance, and
the second set of data lines and the first set of data lines are interleaved.

7. The memory device of claim 1, further comprising:
a buffer between the second set of data drivers and the second set of DQ ports, the buffer electrically coupled to the second set of data drivers and the second set of DQ ports and configured to receive and retransmit the second data; and
wherein:
the delay duration is associated with a timing corresponding to the buffer.

8. The memory device of claim 1, wherein the delay duration is between 0.1 picosecond and 1000 picosecond.

9. The memory device of claim 1 comprises a dynamic random access memory (DRAM).

10. The memory device of claim 1, wherein:
the first set of data drivers and the second set of data drivers comprise a data junction located at a center portion of the memory device; and
the first set of DQ ports and the second set of DQ ports are located away from the data junction.

11. A method of operating a memory device, the method comprising:
determining a first pad location, wherein the first pad location comprises a location on the memory device of a first data port configured to receive a first data from a first driver on the memory device;
determining a second pad location, wherein the second pad location comprises a location on the memory device of a second data port configured to receive a second data from a second driver on the memory device;
calculating a delay duration based on the first driver location and the second pad location, the delay duration configured to differentiate a first clock signal from a second clock signal, wherein:
the delay duration represents a difference in propagation delays associated with (1) signal combinations between adjacent circuits, (2) distances between data drivers and corresponding data ports, (3) retransmissions between the data drivers and the corresponding data ports, (4) relative locations of the data drivers and the corresponding data ports, or a combination thereof,
the first clock signal is configured to trigger transmission of the first data, and
the second clock signal is configured to trigger transmission of the second data; and configuring a timing module to generate the first clock signal and the second clock signal according to the delay duration;

wherein:

calculating the delay duration includes calculating the delay duration greater than a positive-coupling delay associated with a positive coupling scenario, less than a negative-coupling delay associated with a negative coupling scenario, or both, wherein— the positive-coupling delay and the negative-coupling delay represent durations between transmission of the second data and arrival of the second data at the second data port for corresponding scenarios, the positive coupling scenario corresponds to the second data having a transition simultaneous with matching transitions in the first data and data communicated in the second adjacent circuit, and the negative coupling scenario corresponds to the second data having a transition simultaneous with differently shaped transitions in the first data and data communicated in the second adjacent circuit.

12. The method of claim 11, wherein calculating the delay duration includes calculating the delay duration based on one or more characteristics of communication circuits configured to communicate data, wherein the one or more characteristics include fringing capacitances associated with physical configuration of data lines connecting data drivers to the data ports, a buffer between the second data driver and the second data port, a port separation distance representing a difference in distances of the first and second data ports from the corresponding first and second data drivers, or a combination thereof.

13. A memory device, comprising:

a first set of data drivers configured to send a first data according to a first clock signal;

a first set of DQ ports electrically coupled to the first set of data drivers, the first set of DQ ports configured to receive the first data from the first set of data drivers;

a second set of data drivers configured to send a second data according to a second clock signal, wherein:

the second clock signal does not match the first clock signal, and a temporal relationship exists between the first clock signal and the second clock signal, wherein the temporal relationship represents a difference in propagation delays associated with (1) signal combinations between adjacent circuits, (2) distances between data drivers and corresponding DQ ports, (3) retransmissions between the data drivers and the corresponding DQ ports, (4) relative locations of the data drivers and the corresponding DQ ports, or a combination thereof, a second set of DQ ports electrically coupled to the second set of data drivers, the second set of DQ ports configured to receive the second data from the second set of data drivers, wherein a distance between the second set of data drivers and the second set of DQ ports is greater than a distance between the first set of data drivers and the first set of DQ ports by a port separation distance;

a delay module configured to generate the first clock signal based on delaying the second clock signal by a delay duration that is based on the port separation distance; and a first set of data lines having a first length and electrically connecting the first set of data drivers to the first set of DQ ports; and a second set of data lines having a second length and electrically connecting the second set of data drivers to the second set of DQ ports, wherein:

the second length is greater than the first length by the port separation distance, and the second set of data lines and the first set of data lines are interleaved.

* * * * *